(12) United States Patent
Bolken et al.

(10) Patent No.: US 8,426,954 B2
(45) Date of Patent: Apr. 23, 2013

(54) METHODS OF FABRICATION OF PACKAGE ASSEMBLIES FOR OPTICALLY INTERACTIVE ELECTRONIC DEVICES AND PACKAGE ASSEMBLIES THEREFOR

(75) Inventors: Todd O. Bolken, Star, ID (US); Chad A. Cobbley, Boise, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

(21) Appl. No.: 13/212,579

(22) Filed: Aug. 18, 2011

(65) Prior Publication Data

US 2011/0298077 A1 Dec. 8, 2011

Related U.S. Application Data

(60) Division of application No. 11/646,991, filed on Dec. 28, 2006, now Pat. No. 8,008,762, which is a continuation of application No. 11/118,498, filed on Apr. 29, 2005, now Pat. No. 7,169,645, which is a division of application No. 10/664,845, filed on Sep. 17, 2003, now Pat. No. 6,995,462.

(51) Int. Cl.
*H01L 23/02* (2006.01)

(52) U.S. Cl.
USPC ............ 257/680; 257/E21.499; 257/434; 257/681; 438/106; 438/116

(58) Field of Classification Search ........... 257/E21.499, 257/431–434, 680, 681, 678, 787; 438/106, 438/110, 113–116, 118, 127
See application file for complete search history.

(56) References Cited

U.S. PATENT DOCUMENTS

| | | | |
|---|---|---|---|
| 4,418,284 A | 11/1983 | Ogawa et al. | |
| 4,894,707 A | 1/1990 | Yamawaki et al. | |
| 5,321,204 A | 6/1994 | Ko | |
| 5,418,566 A | 5/1995 | Kameishi | |
| 5,433,911 A | 7/1995 | Ozimek et al. | |
| 5,534,725 A * | 7/1996 | Hur ............................. | 257/434 |
| 5,753,857 A | 5/1998 | Choi | |
| 5,811,799 A | 9/1998 | Wu | |
| 5,865,935 A | 2/1999 | Ozimek et al. | |
| 6,011,294 A | 1/2000 | Wetzel | |
| 6,076,737 A | 6/2000 | Gogami et al. | |
| 6,143,588 A | 11/2000 | Glenn | |
| 6,266,197 B1 | 7/2001 | Glenn et al. | |
| 6,285,064 B1 | 9/2001 | Foster | |
| 6,342,406 B1 * | 1/2002 | Glenn et al. .................... | 438/57 |
| 6,351,027 B1 | 2/2002 | Giboney et al. | |
| 6,358,773 B1 | 3/2002 | Lin et al. | |

(Continued)

*Primary Examiner* — Chris Chu
(74) *Attorney, Agent, or Firm* — Lerner, David, Littenberg, Krumholz & Mentlik, LLP

(57) ABSTRACT

Packaging assemblies for optically interactive devices and methods of forming the packaging assemblies in an efficient manner that eliminates or reduces the occurrence of process contaminants. In a first embodiment, a transparent cover is attached to a wafer of semiconductor material containing a plurality of optically interactive devices. The wafer is singulated, and the optically interactive devices are mounted on an interposer and electrically connected with wire bonds. In a second embodiment, the optically interactive devices are electrically connected to the interposer with back side conductive elements. In a third embodiment, the optically interactive devices are mounted to the interposer prior to attaching a transparent cover. A layer of encapsulant material is formed over the interposer, and the interposer and encapsulant material are cut to provide individual packaging assemblies. In a fourth embodiment, the optically interactive devices are mounted in a preformed leadless chip carrier.

10 Claims, 15 Drawing Sheets

U.S. PATENT DOCUMENTS

| | | |
|---|---|---|
| 6,401,545 B1 | 6/2002 | Monk et al. |
| 6,428,650 B1 | 8/2002 | Chung |
| 6,435,028 B1 | 8/2002 | Nagahara |
| 6,441,478 B2 | 8/2002 | Park |
| 6,455,927 B1 | 9/2002 | Glenn et al. |
| 6,492,699 B1 * | 12/2002 | Glenn et al. ............ 257/433 |
| 6,509,560 B1 | 1/2003 | Glenn et al. |
| 6,534,340 B1 | 3/2003 | Karpman et al. |
| 6,566,745 B1 | 5/2003 | Beyne et al. |
| 6,603,183 B1 | 8/2003 | Hoffman |
| 6,649,991 B1 | 11/2003 | Chen et al. |
| 6,667,543 B1 | 12/2003 | Chow et al. |
| 6,710,461 B2 * | 3/2004 | Chou et al. ............. 257/780 |
| 6,753,203 B1 | 6/2004 | Dai |
| 6,762,492 B2 | 7/2004 | Nakajima et al. |
| 6,803,886 B2 | 10/2004 | Kondo et al. |
| 6,822,326 B2 | 11/2004 | Enquist et al. |
| 6,856,014 B1 | 2/2005 | Ehmke et al. |
| 6,873,024 B1 * | 3/2005 | Prabhu et al. ............ 257/434 |
| 6,874,227 B2 | 4/2005 | Hsin et al. |
| 6,900,531 B2 | 5/2005 | Foong et al. |
| 6,905,910 B1 | 6/2005 | Shiu et al. |
| 6,934,065 B2 | 8/2005 | Kinsman |
| 7,002,241 B1 | 2/2006 | Mostafazadeh et al. |
| 7,083,999 B2 * | 8/2006 | Hashimoto ............... 438/60 |
| 7,154,053 B2 | 12/2006 | Hsu |
| 7,199,438 B2 | 4/2007 | Appelt et al. |
| 7,214,996 B2 | 5/2007 | Perillat |
| 7,321,455 B2 * | 1/2008 | Kinsman ................. 359/245 |
| 7,351,951 B2 | 4/2008 | Van Arendonk |
| 7,414,310 B2 | 8/2008 | Do et al. |
| 7,566,588 B2 * | 7/2009 | Kameyama et al. ......... 438/116 |
| 7,701,044 B2 * | 4/2010 | Kang et al. .............. 257/680 |
| 7,932,121 B2 * | 4/2011 | Watanabe ................ 438/64 |
| 8,013,350 B2 * | 9/2011 | Itoi et al. ............... 257/98 |
| 8,252,628 B2 * | 8/2012 | Nabe et al. .............. 438/106 |
| 2004/0164981 A1 | 8/2004 | Fujita et al. |
| 2007/0210399 A1 * | 9/2007 | Lee et al. ............... 257/434 |

* cited by examiner

METHODS OF FABRICATION OF PACKAGE ASSEMBLIES FOR OPTICALLY INTERACTIVE ELECTRONIC DEVICES AND PACKAGE ASSEMBLIES THEREFOR

CROSS-REFERENCE TO RELATED APPLICATIONS

This application is a divisional of U.S. application Ser. No. 11/646,991, which was filed on Dec. 28, 2006, which is scheduled to issue on Aug. 30, 2011, as U.S. Pat. No. 8,008,762, which is a continuation of U.S. application Ser. No. 11/118,498, which was filed on Apr. 29, 2005, which issued on Jan. 30, 2007 as U.S. Pat. No. 7,169,645, which is a divisional of U.S. application Ser. No. 10/664,845, filed Sep. 17, 2003, which issued on Feb. 7, 2006 as U.S. Pat. No. 6,995,462, the disclosure of which is incorporated herein by reference.

The present invention relates to packaging for optically interactive electronic devices. More particularly, the present invention relates to package assemblies for solid-state image sensors wherein a transparent cover is adhesively attached over the active surface of an image sensor chip and the image sensor chip is sealed within an encapsulant. The present invention also relates to methods of fabricating the image sensor package assemblies in an efficient manner to eliminate or reduce the potential for deposition of contaminants on the image sensor chip active surface during the fabrication process.

Optically interactive electronic devices, for example, charge coupled device (CCD) image sensors or complementary metal-oxide semiconductor (CMOS) image sensors, are typically enclosed within a package for subsequent connection to higher-level packaging such as a larger circuit assembly in the form of a carrier substrate. The package provides electrical interconnection to the larger circuit assembly, provides protection from the surrounding environment and allows light or other forms of radiation to pass through to sensing circuitry located on the image sensor device. In the prior art, package formation has often been accomplished by placing an image sensor device in the form of a semiconductor chip into the cavity of a plastic or ceramic housing, wire bonding electrical connection points on the semiconductor chip to conductive pads associated with the housing and sealing a window or transparent cover over the cavity. The materials and structure involved with this packaging technique require a fabrication process that can be time consuming and requires several precision assembly steps. Further, each assembly step increases the opportunity for contamination or damage to the image sensor device itself, raising defect levels and slowing production time to avoid such damage and contamination. Due to the extremely cost-competitive nature of today's semiconductor industry, even small improvements in product yield and production time are of value, especially when considered in terms of the high volume of components being manufactured.

In response to large-scale production requirements, various attempts have been made to simplify the construction of image sensor packaging. U.S. Pat. No. 6,351,027 to Giboney et al. and U.S. Pat. No. 6,285,064 to Foster, for instance, disclose wafer-level packaging formed by laying a solid sidewall piece or an adhesive matrix over a wafer having an array of sensor devices and covering it with one or more transparent top pieces. The wafer is then singulated to create discrete chip-scale packages. While these packaging techniques reduce material costs and assembly steps, they do not completely protect the semiconductor chips from the environment and may require complicated process steps for forming electrical connections to the sensor devices. U.S. Pat. No. 6,266,197 to Glenn et al. discloses a method for forming image sensor packages wherein an array of image sensors is wire bonded to a carrier substrate, and a molded window array is placed over the array of image sensors. The substrate and attached molded window array are then singulated to form a plurality of individual image sensor packages. The molded window array of Glenn et al., however, suffers from the fact that individual transparent windows must be formed within, or later attached to the molded array, requiring additional assembly and alignment steps during fabrication. U.S. Pat. No. 5,811,799 to Wu discloses an image sensor package formed by attaching a plurality of preformed or glue walls to an array of printed wiring frames having image sensors thereon and sealing the walls with transparent material. The printed wiring frames are then diced to form discrete packages. Once again, this arrangement may require the attachment or formation of multiple components during fabrication and may increase the occurrence of process contamination.

As is evident from the foregoing description of the state of the art, a simplified method is needed for forming an image sensor package that is conducive to mass production while still offering suitable and robust mechanical and environmental protection for an image sensor chip.

BACKGROUND OF THE INVENTION

In accordance with the present invention, a plurality of package assemblies for image sensors and other optically interactive electronic devices are simultaneously fabricated to minimize process steps and reduce the cost associated with each individual package. The methods of fabrication also reduce the possibility of contaminants being deposited on the active surface of a device during assembly. While the following exemplary packaging embodiments are depicted in terms of image sensor chips, it should be understood that the package assemblies and methods presented herein would work equally well for enclosing other types of optically interactive electronic devices. The term "optically interactive" as used herein is meant to encompass devices sensitive to various wavelengths of light or other forms of radiation, including, but not limited to, CCD and CMOS image sensors, EPROMs, and photodiodes, as well as light-emitting devices including semiconductor lasers and light-emitting diodes.

In a first embodiment according to the present invention, a wafer of semiconductor material is provided containing a plurality of image sensor chips with active surfaces arranged in an array on the front side of the wafer. The active surface of each image sensor chip includes an image sensitive area and bond pads for providing electrical connection to internal circuitry of the image sensor chip. A transparent cover of a size sufficient to cover the array of image sensor chip active surfaces is attached to the front side of the wafer using an adhesive material. The adhesive material is formed in a pattern such that, when the transparent cover is attached, the adhesive material lies between the bond pads and the image sensitive area on the active surface of each image sensor chip. The pattern of adhesive material may be applied to the front side of the wafer and/or to the transparent cover.

Once the wafer and transparent cover are joined, a layer of semiconductor material is removed from the back side of the wafer by backgrinding to reduce the image sensor chips to a desired thickness. A dicing or singulating operation is then carried out to separate the image sensor chips from the wafer. In a first stage of the dicing operation, the transparent cover is cut along the edge of the pattern of adhesive material surrounding the image sensitive area on the active surface of each image sensor chip. The bond pads on the active surface of each image sensor chip are thus left exposed for further processing, while the image sensitive area of the active surface is sealed by the remaining portion of the transparent cover. In a second stage of the dicing operation, the wafer is cut along streets of semiconductor material located between adjacent image sensor chips for complete separation.

Each individual image sensor chip is subsequently affixed to an interposer substrate having conductive traces. The conductive traces extend from attachment pads formed on a first surface of the interposer to which the image sensor chips are attached, to external connection points on a second, opposing surface of the interposer. Wire bonds are formed to electrically connect the image sensor chip bond pads with the interposer attachment pads. A layer of encapsulant material is then formed over the first surface of the interposer to cover the wire bond locations and surround the edges of the transparent cover attached to each image sensor chip. Discrete conductive elements such as solder balls are formed on, or attached to the external connection points of the interposer, and the interposer is singulated to provide individual image sensor package assemblies.

In a second embodiment according to the present invention, image sensor package assemblies are formed as in the first embodiment, but the image sensor chips are not connected to the interposer attachment pads using wire bonds. Instead, the image sensor chips include back side conductive elements configured for direct connection to the interposer attachment pads. In one variant of the second embodiment, the image sensor chips include conductive vias extending from the image sensor chip active surfaces into the wafer semiconductor material. The vias are exposed through the back side of the wafer during the backgrinding process and conductive elements such as bumps or pads are formed over the vias on the back side of the wafer. The back side conductive elements may then be directly connected to the interposer attachment pads. In another variant of the second embodiment, after separating the image sensor chips from the wafer, a redistribution layer (RDL) may be formed on each image sensor chip to provide conductive traces extending from the bond pads to the edge of the active surface and down to the back side of the image sensor chip. Conductive bumps or pads may then be formed on the RDL traces at locations configured for direct connection to the interposer attachment pads.

In a third embodiment according to the present invention, the transparent cover is not attached to the image sensor chips at the wafer level. Instead, after dicing the wafer, the individual image sensor chips are affixed to the interposer and electrically connected to the interposer attachment pads. Individual transparent covers are attached to each of the image sensor chips with an adhesive material. The formation of the layer of encapsulant material, discrete conductive elements and singulation of the interposer are then carried out as in the first embodiment. The third embodiment enables the transparent cover to overlie the entire active surface of an image sensor chip and also allows the adhesive material to be placed directly over any wire bond connections.

In a fourth embodiment according to the present invention, image sensor package assemblies are formed by mounting individual image sensor chips within the cavity of a preformed leadless chip carrier (LCC). In one variant of the fourth embodiment, individual image sensor chips having transparent covers are affixed to an interposer substrate as in the first through third embodiments. Discrete conductive elements are included on the external connection points of the interposer; however, the interposer is singulated without adding a layer of encapsulant material to form a packaging subassembly. The packaging subassembly is then mounted within the cavity of an LCC, and the cavity is filled with a liquid sealant that covers the packaging subassembly and surrounds the edges of the transparent cover attached to each image sensor chip. In another variant of the fourth embodiment individual image sensor chips are formed with transparent covers as in the first through third embodiments, and are affixed directly to the bottom of the LCC cavity such that the LCC itself is the interposer substrate. The cavity is filled with a liquid sealant that covers the packaging subassembly and surrounds the edges of the transparent cover attached to each image sensor chip.

Other and further features and advantages of the present invention will be apparent from the following descriptions of the various embodiments when read in conjunction with the accompanying drawings. It will be understood by one of ordinary skill in the art that the following embodiments are provided for illustrative and exemplary purposes only, and that numerous combinations of the elements of the various embodiments of the present invention are possible.

DETAILED DESCRIPTION

Figure 1A:
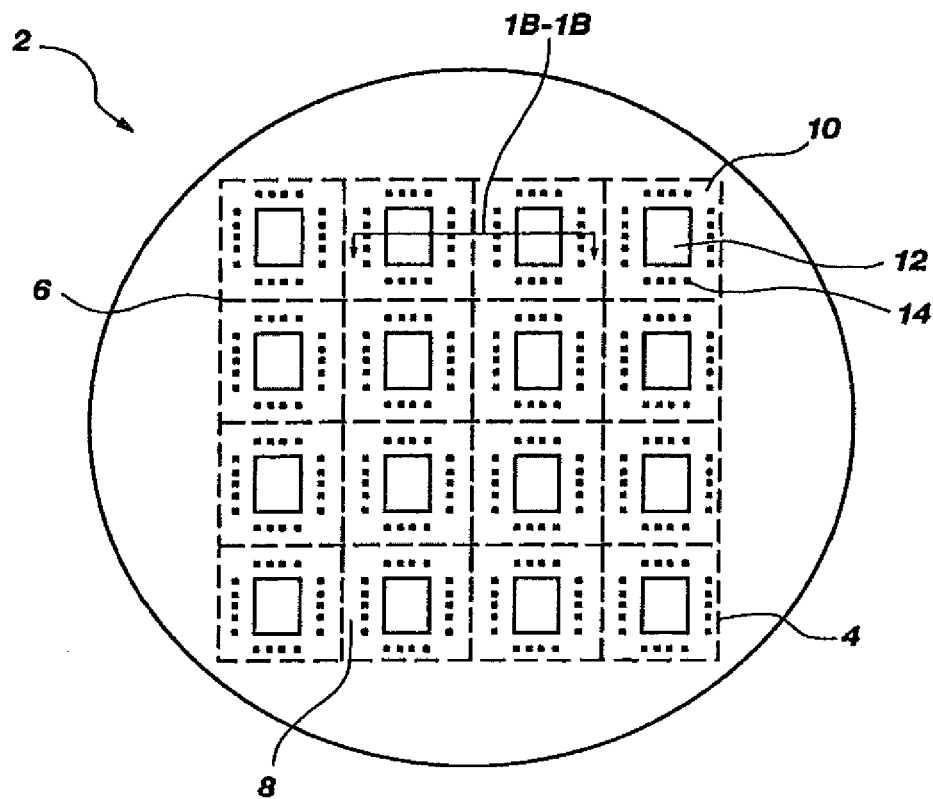
FIG. 1A is a top view of a semiconductor wafer containing an array of image sensor chips.
Figure 1B:
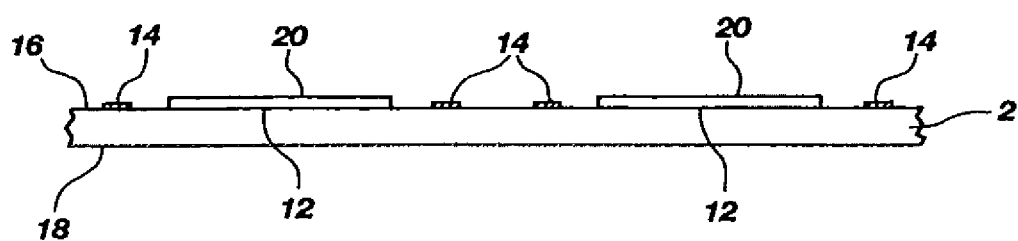
FIG. 1B is a sectional side view taken along line 1B-1B in FIG. 1A.

Referring in general to the accompanying drawings, various aspects of the present invention are illustrated to show exemplary image sensor package assemblies as well as methods for their construction. Common elements of the illustrated embodiments are designated with like reference numerals for clarity. It should be understood that the figures presented are not meant to be illustrative of actual views of any particular portion of a particular image sensor assembly, but are merely idealized schematic representations which are employed to more clearly and fully depict the invention. It should further be understood that while depicted in terms of image sensors, the package embodiments and methods presented herein would work equally well for housing other types of optically interactive electronic devices as described above.

The formation of image sensor package assemblies according to a first embodiment of the present invention is illustrated by FIGS. 1A-11. In FIG. 1A, an exemplary wafer 2 of semiconductor material is provided containing a plurality of image sensor chips 4. It should be noted that the present invention is applicable to bulk semiconductor substrates other than traditional wafers, and the term "wafer" as employed herein encompasses such other substrates. The outer edges 6 of image sensor chips 4, schematically depicted by section lines, are defined along streets 8 of semiconductor material located between adjacent image sensor chips 4. Each image sensor chip 4 includes an active surface 10 having an image sensitive area 12 and bond pads 14. Image sensitive area 12 comprises sensing circuitry reactive to light or other forms of radiation. FIG. 1B is an enlarged cross section of wafer 2 taken along line 1 B-1 B in FIG. 1A. As can be seen in FIG. 1B, wafer 2 has a front side 16 and an opposing back side 18, with bond pads 14 being peripherally spaced around image sensitive area 12 on the front side 16 of wafer 2. While bond pads 14 are depicted in a single row along each of the four sides of image sensitive area 12, other arrangements are possible, for example and not by way of limitation, having bond pads 14 formed along fewer sides or in multiple rows along one or more sides. For certain types of image sensors, FIG. 1B shows that image sensitive area 12 may also comprise microlenses 20 formed over the sensing circuitry to aid in the reception of light.

Figure 2:
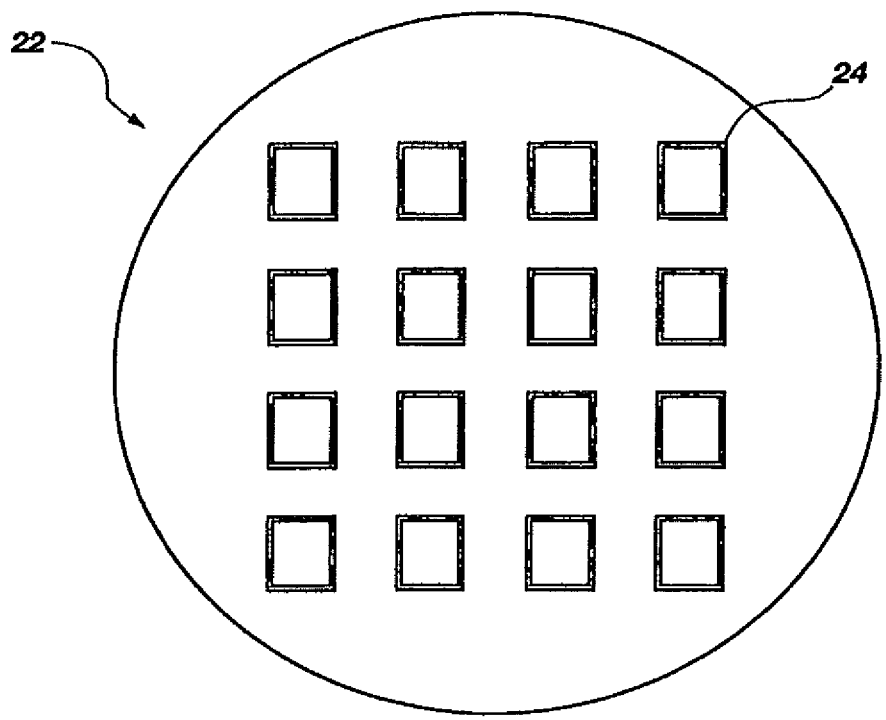
FIG. 2 is a top view of a transparent cover having a pattern of adhesive material applied thereto.
Figure 3:
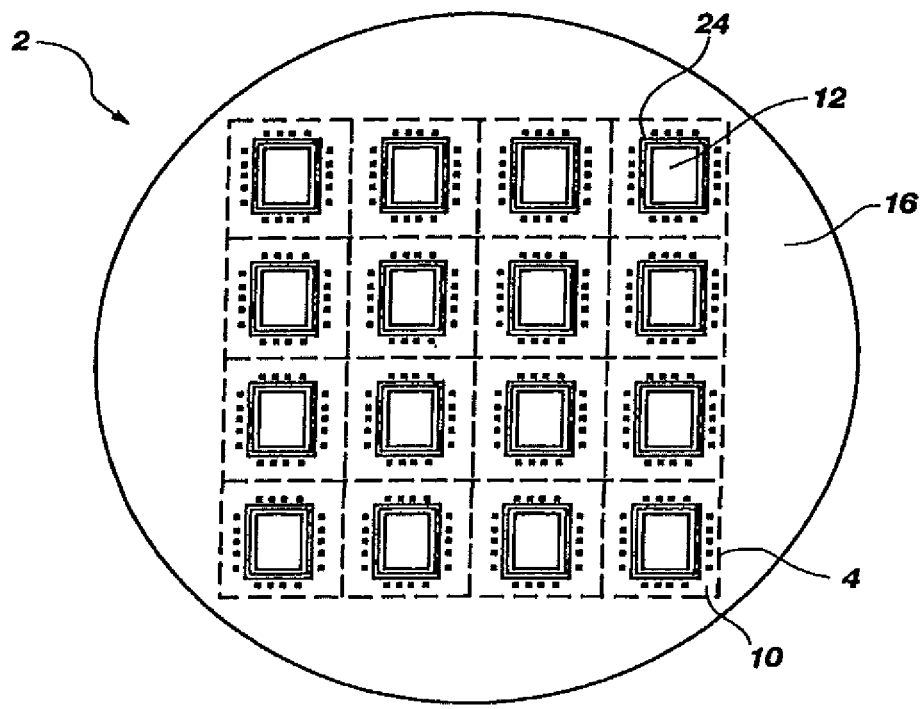
FIG. 3 is a top view of the semiconductor wafer in FIG. 1A having a pattern of adhesive material applied thereto.

Turning to FIGS. 2-4B, a transparent cover 22 of a size sufficient to cover the array of image sensor chip active surfaces 10 is attached to the front side 16 of wafer 2 using an adhesive material 24. Transparent cover 22 may be formed of an at least partially optically transparent material such as borosilicate glass (BSG). Other types of glass, quartz or even plastic of suitable material characteristics and which allow the passage of a desired range of wavelengths of light or other forms of electromagnetic radiation may also be used. Furthermore, portions of transparent cover 22 may be formed to provide an optical function, for example, by shaping its surface at locations corresponding to image sensitive areas 12 to act as a focusing lens. FIG. 2 shows adhesive material 24 applied to transparent cover 22 in a pattern that corresponds to the periphery of the image sensitive area 12 of each image sensor chip 4. FIG. 3 shows that the pattern of adhesive material 24 may instead, or in addition, be applied directly to the front side 16 of wafer 2. Adhesive material 24 may be in the form of an epoxy, a silicone, an acrylic or other liquid-type adhesive applied to transparent cover 22 and/or the front side 16 of wafer 2, or may comprise a double-sided adhesive-coated tape segment or film, such as a polyimide. Alternatively, a two-component resin may be employed, with one component applied in an appropriate pattern to transparent cover 22 and the other to front side 16 of wafer 2 to prevent premature component reaction and adhesion.

Figure 4A:
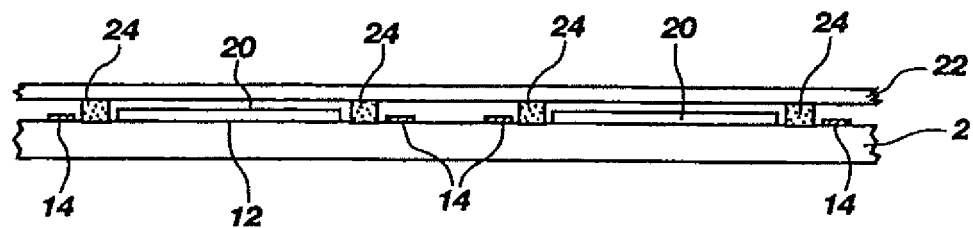
FIG. 4A is a sectional side view of adhesive material positioned between bond pads and an image sensitive area of an image sensor chip.
Figure 4B:
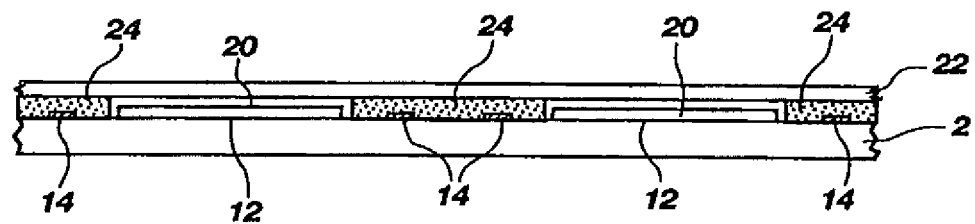
FIG. 4B is a sectional side view of adhesive material covering bond pads around an image sensitive area of an image sensor chip.

FIG. 4A, which is a sectional side view of wafer 2, shows that when transparent cover 22 is attached, adhesive material 24 lies between bond pads 14 and image sensitive area 12 of the active surface 10 of each image sensor chip 4 (FIG. 3). FIG. 4A also shows that in the case where image sensitive area 12 includes microlenses 20, adhesive material 24 is formed to have a thickness providing a standoff space between microlenses 20 and transparent cover 22. This avoids undesirable refraction or other optical variations that may result from contact between microlenses 20 and transparent cover 22. In some cases, it may be desirable to apply adhesive material 24 in a pattern that also covers bond pads 14 in order to provide protection during subsequent processing, as will be described in further detail below. FIG. 4B shows a sectional side view of wafer 2 with bond pads 14 covered by adhesive material 24.

Figure 5:
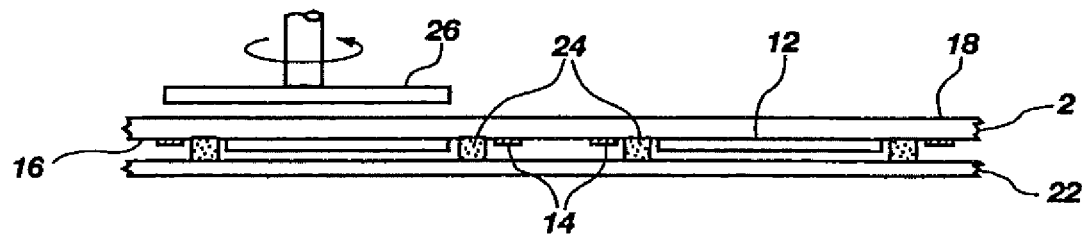
FIG. 5 is a schematic representation of a backgrinding process.

Once transparent cover 22 has been joined with wafer 2, a layer of semiconductor material is removed from the back side 18 of wafer 2 using a backgrinding process. Reducing the thickness of wafer 2 in this manner minimizes the final package size (thickness) and reduces the time and expense associated with cutting wafer 2 during the subsequent dicing operation. Furthermore, backgrinding removes undesirable contaminants which may have been introduced into the back side 18 of wafer 2 during fabrication. FIG. 5 is a schematic representation of the backgrinding process wherein a grinding wheel 26 is applied to the back side 18 of wafer 2. As can be seen in FIG. 5, the prior attachment of transparent cover 22 shields the front side 16 of wafer 2, thereby eliminating the potential for contamination from particles generated during backgrinding that might otherwise be deposited on image sensitive areas 12.

Figure 6A:
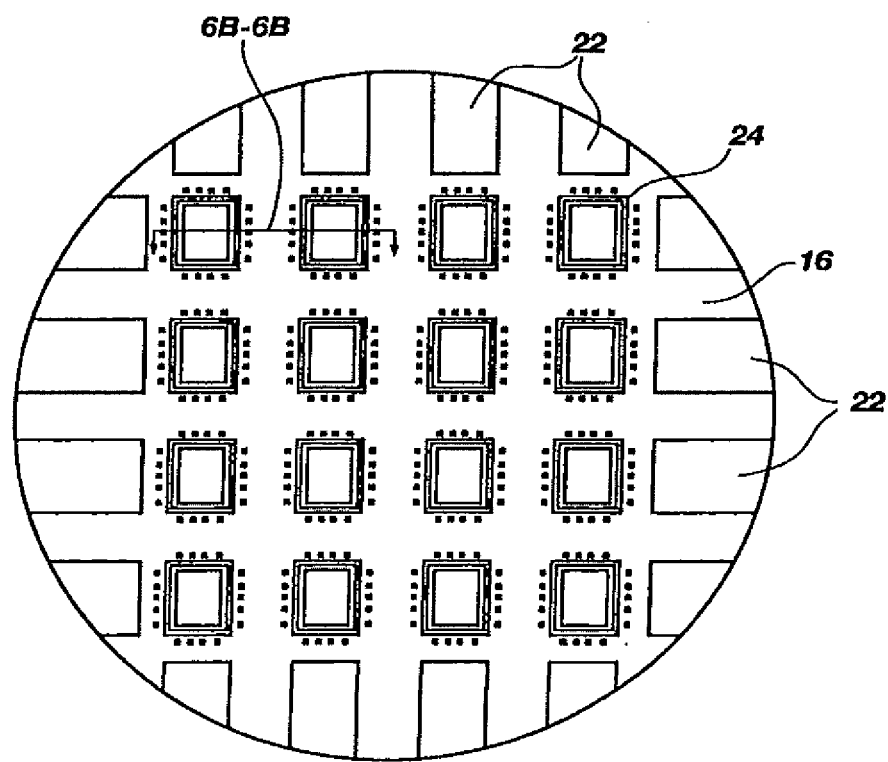
FIG. 6A is a top view of a semiconductor wafer.
Figure 6B:
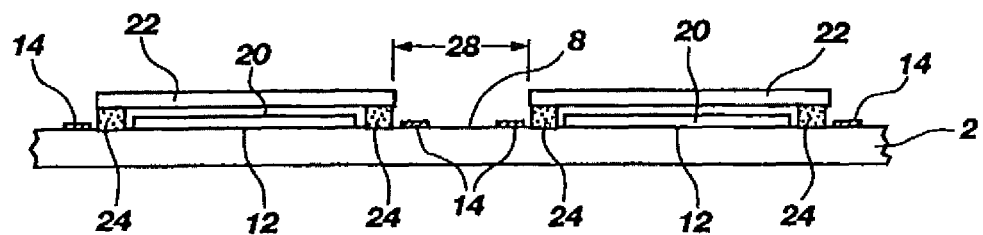
FIG. 6B is a sectional side view taken along line 6B-6B in FIG. 6A.

After backgrinding wafer 2 to the desired thickness, a dicing operation is carried out to separate image sensor chips 4 from wafer 2. In a first stage of the dicing operation shown in FIG. 6A, transparent cover 22 is cut along the edge of the pattern of adhesive material 24 surrounding the image sensitive area 12 of each image sensor chip 4. FIG. 6B, which is an enlarged cross section of wafer 2 taken along line 6B-6B in FIG. 6A, shows that the bond pads 14 of each image sensor chip 4 (FIG. 1A) are left exposed for receiving electrical connections, while image sensitive area 12 is sealed by the remaining portion of transparent cover 22 overlying adhesive material 24. Cutting of transparent cover 22 may be accomplished, by way of example, using a saw blade (not shown) having a width that is equal to the distance 28 between adjacent edges of adhesive material 24 surrounding each image sensitive area 12. In this manner, the entire portion of transparent cover 22 between adjacent image sensitive areas 12 may be removed by a single saw pass along a street 8. A narrower saw blade may also be used, with two saw passes being made to expose bond pads 14.

Figure 7A:
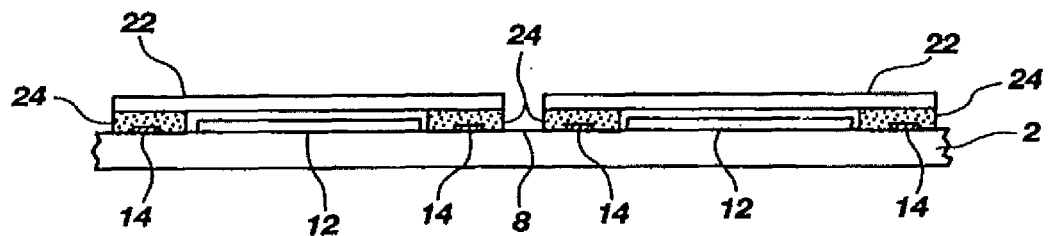
FIGS. 7A and 7B are sectional side views showing an alternative first stage of the wafer dicing operation.
Figure 7B:
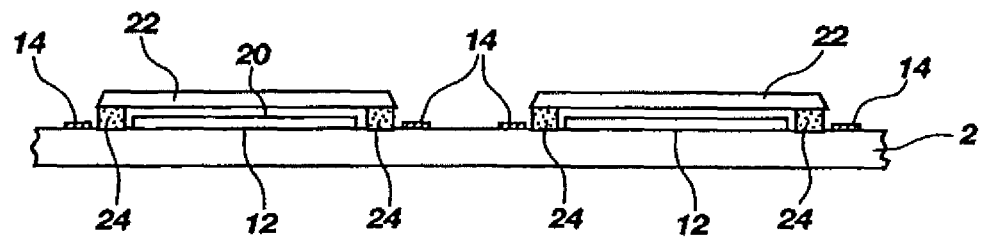

FIGS. 7A and 7B show an alternative to the first stage of the dicing operation where adhesive material 24 has been formed in a pattern covering bond pads 14, as previously depicted in FIG. 4B. In FIG. 7A, transparent cover 22 is cut with a narrow saw blade (not shown) down the middle of street 8. An etching process is then carried out to remove the portions of transparent cover 22 and adhesive material 24 covering bond pads 14, as seen in FIG. 7B. Using this alternative process protects bond pads 14 and prevents the deposition of contaminants while cutting transparent cover 22.

Figure 8:
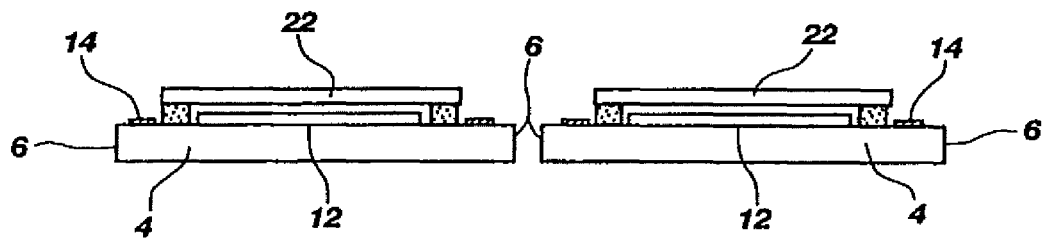
FIG. 8 is a sectional side view showing a second stage of the wafer dicing operation.

In a second stage of the dicing operation shown in FIG. 8, wafer 2 is cut along streets 8 (FIG. 7A) of semiconductor material at the outer edges 6 of image sensors chips 4 for complete separation of wafer 2 into individual image sensor chips 4. Any conventional process for cutting wafer 2 may be used, such as with a dicing saw. FIG. 8 shows that each individual image sensor chip 4 includes an image sensitive area 12 sealed by a remaining portion of transparent cover 22, as well as bond pads 14 left exposed for later electrical connection.

Figure 9:
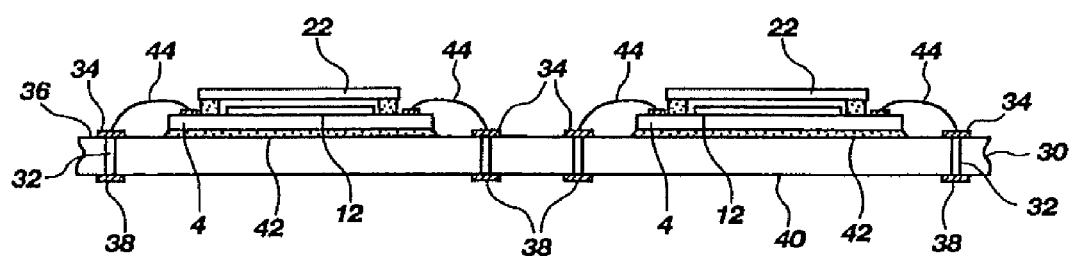
FIG. 9 is a sectional side view showing image sensor chips attached to an interposer according to a first embodiment of the present invention.

In the next stage of package formation according to the first embodiment, FIG. 9 shows that each individual image sensor chip 4 is affixed to an interposer 30. Interposer 30 includes conductive pathways 32 extending from attachment pads 34 on a first surface 36 of interposer 30, to external connection points 38 on a second, opposing surface 40 of interposer 30. Image sensor chips 4 may be adhesively mounted to the first surface 36 of interposer 30 with an adhesive element comprising a layer of adhesive 42 such as an epoxy or by an adhesive-coated tape in a lamination process as known in the art. Wire bonds 44 are then formed to electrically connect the image sensor chip bond pads 14 with the attachment pads 34 of interposer 30. As can be seen in FIG. 9, the first embodiment of the present invention enables the wire bonding process to be carried out while image sensitive area 12 is sealed under transparent cover 22.

Figure 10:
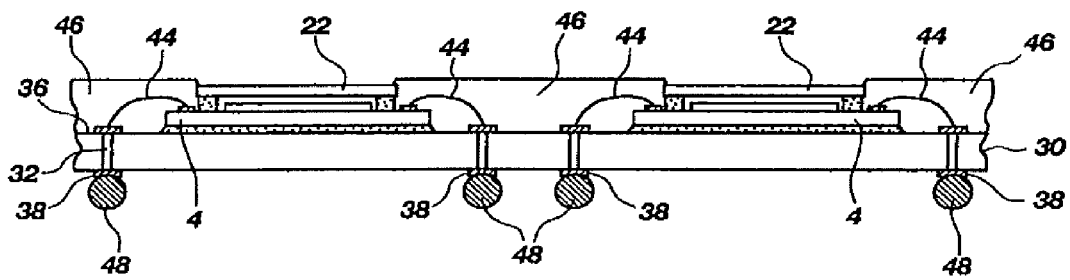
FIG. 10 is a sectional side view showing a layer of encapsulant formed on the interposer of FIG. 9.

FIG. 10 shows that after the wire bonding process is complete, a layer of encapsulant material 46 is formed over the first surface 36 of interposer 30 to cover wire bonds 44 and surround the edges of the portion of transparent cover 22 attached to each image sensor chip 4. Encapsulant material 46 may comprise any conventional compound known for use in encapsulating semiconductor chips that exhibits low moisture uptake and good dimensional stability. Encapsulant material 46 should also be selected to have a coefficient of thermal expansion (CTE) that is compatible with those of interposer 30 and image sensor chips 4. Examples of encapsulant material 46 contemplated for use in the present invention include, but are not limited to, thermoset or thermoplastic curable compounds such as silicon-filled polymers or liquid crystal polymers. The layer of encapsulant material 46 may be formed on interposer 30 by known transfer molding, pot molding or injection molding, by liquid dispensing, by photolithographic or stereolithographic deposition processes, or as otherwise known in the art.

Discrete conductive elements 48 such as solder balls are formed on, or attached to the external connection points 38 of interposer 30 in order to facilitate subsequent attachment to a carrier substrate or other higher-level circuit assembly. While FIG. 10 shows discrete conductive elements 48 as comprising solder balls, it should be understood that bumps of conductive or conductor-filled epoxy or even pads comprising one or more layers of metallic plating may be formed on external connection points 38.

Figure 11:
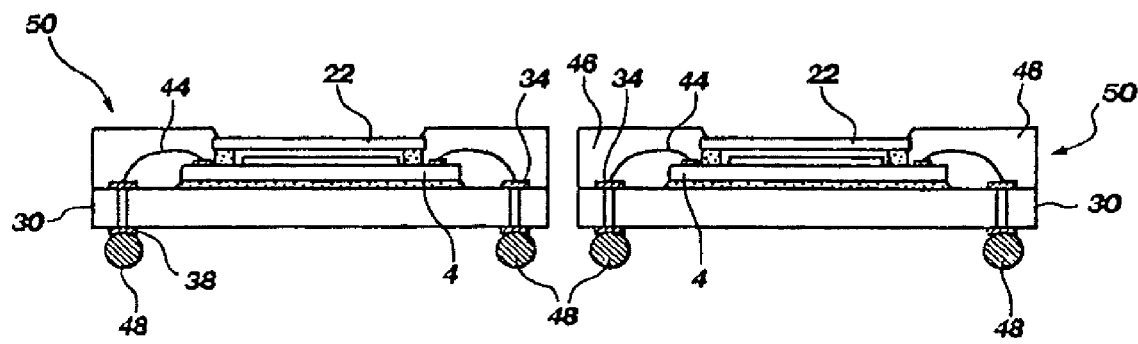
FIG. 11 is a sectional side view of image sensor package assemblies according to the first embodiment of the present invention.

After forming discrete conductive elements 48, FIG. 11 shows that interposer 30 and the layer of encapsulant material 46 are cut along lines extending between adjacent image sensor chips 4 to provide individual image sensor package assemblies 50. This may be accomplished, for example, by cutting or scribing (followed by snapping image sensor package assemblies 50 apart along the scribe lines) with a conventional dicing saw. Alternatively, the individual image sensor package assemblies 50 may be singulated using a laser or other high energy beam.

Image sensor package assemblies 50 according to a second embodiment of the present invention are formed in a manner similar to that of the first embodiment, except image sensor chips 4 are not connected to the interposer attachment pads 34 using wire bonds 44. Instead, the image sensor chips 4 are formed to include back side conductive elements configured for direct connection to attachment pads 34.

Figure 12:
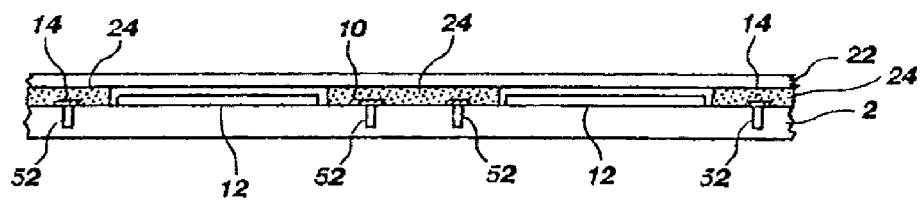
FIGS. 12-15 are sectional side views of the formation of image sensor package assemblies according to a variant of a second embodiment of the present invention.
Figure 13:
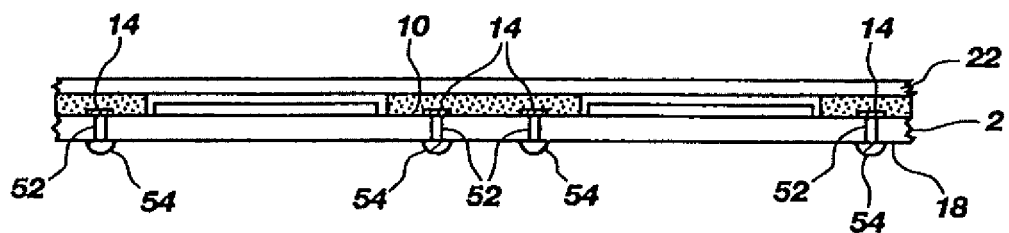

One variant of the second embodiment is shown in FIGS. 12-15. FIG. 12 shows that the image sensor chips 4 include conductive vias 52 extending from bond pads 14 on the image sensor chip active surfaces 10 into the semiconductor material of wafer 2. Because bond pads 14 do not need to be exposed for wire bonding, transparent cover 22 is joined to the front side 16 of wafer 2 by a pattern of adhesive material 24 that covers bond pads 14 in the same manner as depicted in FIG. 4B of the first embodiment. This enables adhesive material 24 to seal the entire active surface 10 of an image sensor chip 4 in the area surrounding image sensitive area 12. FIG. 13 shows that vias 52 are exposed through the back side 18 of wafer 2 during the backgrinding process, and back side conductive elements such as bumps 54 are then formed over vias 52 on the back side 18 of the wafer 2. As with discrete conductive elements 48, conductive bumps 54 may comprise solder, conductive or conductor-filled epoxy, metallic plating, or any other conductive material known for use in forming external conductive elements on semiconductor chips.

Figure 14:
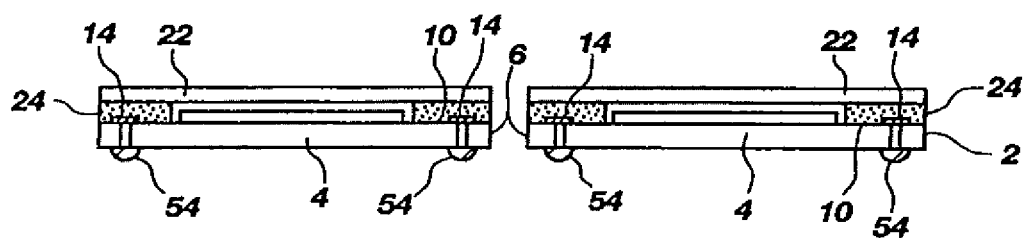
Figure 15:
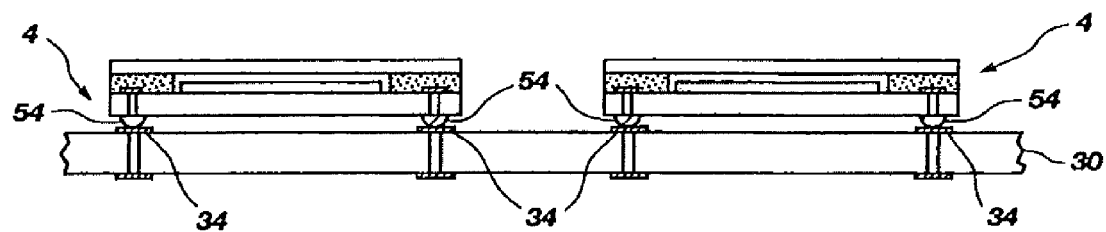

In FIG. 14, wafer 2 and transparent cover 22 are simultaneously cut along streets 8 (FIG. 1A) at the outer edges 6 of image sensor chips 4. Cutting wafer 2 and transparent cover 22 may be carried out in a single pass because bond pads 14 do not require exposure for wire bonding. Therefore, the portion of transparent cover 22 remaining on an image sensor chip 4 after cutting may cover the entire active surface 10. FIG. 15 shows that once cutting is completed, each individual image sensor chip 4 is affixed to interposer 30 by bonding conductive bumps 54 directly to attachment pads 34. Formation of the layer of encapsulant material 46, addition of discrete conductive elements 48, and cutting into individual image sensor package assemblies 50 may then be carried out in the same manner as described in the first embodiment of the present invention.

Figure 16:
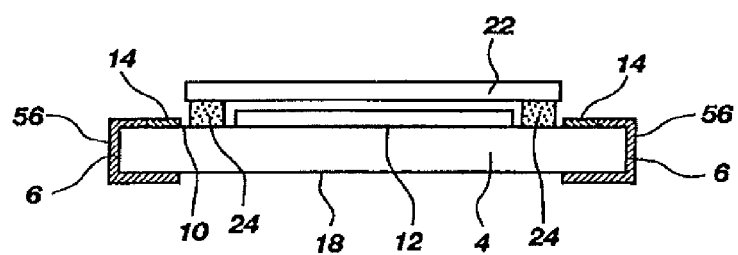
FIGS. 16-17 are sectional side views of the formation of image sensor package assemblies according to another variant of the second embodiment of the present invention.

In another variant of the second embodiment, image sensor package formation is carried out in the same manner as in the first embodiment up through the dicing operation, described with respect to FIGS. 6A-8. According to this variant of the second embodiment, FIG. 16 shows that after separating the image sensor chips 4 from wafer 2, a redistribution layer (RDL) may be provided on each image sensor chip 4 in the form of conductive traces 56 extending from bond pads 14 to the edge of the active surface 10 and down to back side 18. Conductive traces 56 of the RDL may be formed with conventional processes such as by depositing a metallic layer onto the surfaces of image sensor chips 4 by sputtering or chemical vapor deposition (CVD) and then masking and etching the metallic layer to form individual traces. Alternatively, conductive traces 56 may be formed as a TAB-type assembly of preformed traces carried on a polymer film which are bonded to bond pads 14 and adhesively affixed to an image sensor chip 4 to extend around sides thereof and down to back side 18.

Figure 17:
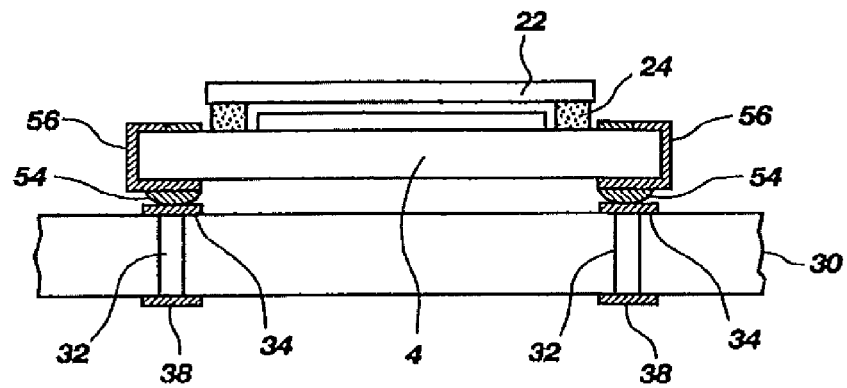

FIG. 17 shows that once conductive traces 56 are formed, back side conductive elements such as conductive bumps 54 may be formed on conductive traces 56 and directly connected to the attachment pads 34 of interposer 30, as in the first variant of the second embodiment. Formation of the layer of encapsulant material 46, addition of discrete conductive elements 48, and cutting into individual image sensor package assemblies 50 may then be carried out in the same manner as described in the first embodiment of the present invention.

Figure 18:
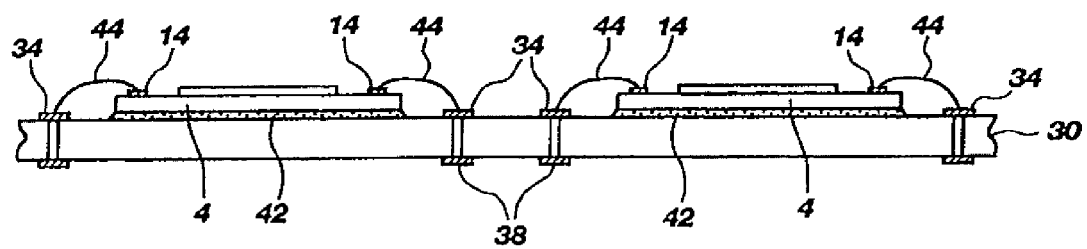
FIGS. 18 and 19 are sectional side views of the formation of image sensor package assemblies according to a third embodiment of the present invention.
Figure 19:
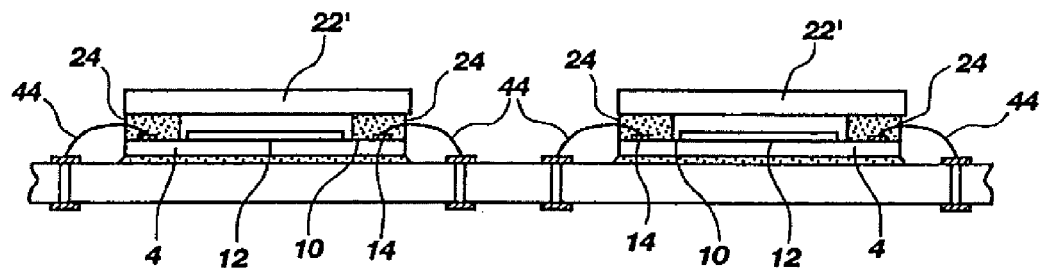

A third embodiment of the present invention is shown in FIGS. 18 and 19. According to the third embodiment, transparent cover 22 is not attached to the image sensor chips 4 at the wafer level. Instead, wafer 2 is initially diced into individual image sensor chips 4, and image sensor chips 4 are affixed to interposer 30 with adhesive layer 42 in an uncovered condition, as seen in FIG. 18. Wire bonds 44 are then formed to electrically connect the image sensor chip bond pads 14 with the attachment pads 34 of interposer 30. FIG. 19 shows that individual transparent covers 22' are subsequently attached to each of the image sensor chips 4 with adhesive material 24. Because wire bonds 44 are formed prior to attaching individual transparent covers 22', adhesive material 24 may be placed directly over the attachment point of wire bonds 44 and bond pads 14, thereby sealing the entire active surface 10 of an image sensor chip 4 in the area surrounding image sensitive area 12. This arrangement also allows individual transparent covers 22' to cover the entirety of active surface 10, which provides protection during subsequent processing. Formation of the layer of encapsulant material 46, addition of discrete conductive elements 48, and cutting into individual image sensor package assemblies 50 may then be carried out in the same manner as described in the first embodiment of the present invention.

Figure 20:
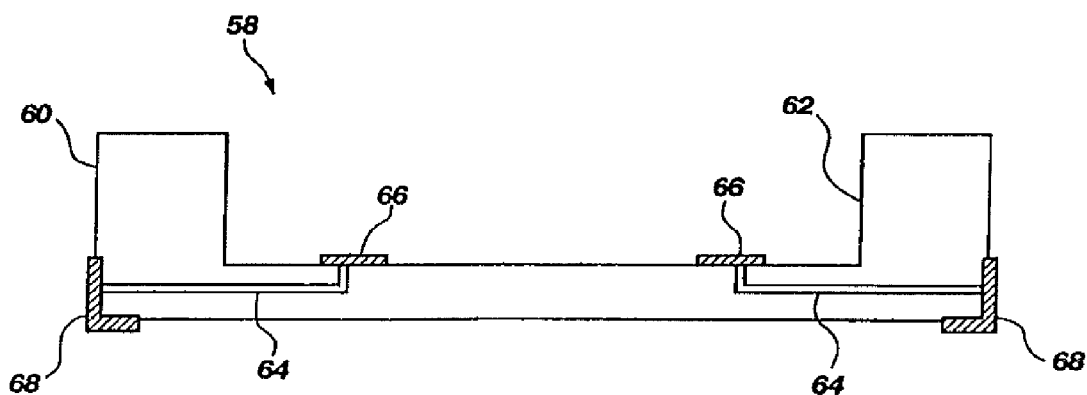
FIG. 20 is a sectional side view of a preformed leadless chip carrier used in a fourth embodiment of the present invention.

In a fourth embodiment of the present invention, image sensor package assemblies are formed by mounting individual image sensor chips within the cavity of a preformed semiconductor package housing such as a leadless chip carrier (LCC). This enables a completed image sensor package assembly, according to the present invention, to be attached to a carrier substrate or other higher-level circuit assembly at an attachment location configured with a standard package footprint. FIG. 20 shows an exemplary preformed package housing comprising a LCC 58 for use with image sensor package assemblies according to the fourth embodiment of the present invention. LCC 58 includes a body 60 of ceramic, plastic, or other conventional LCC package materials, and a chip cavity 62. Conductive pathways 64 extend from attachment pads 66 within chip cavity 60 to solder pads 68 formed about the exterior perimeter of body 60.

Figure 21A:
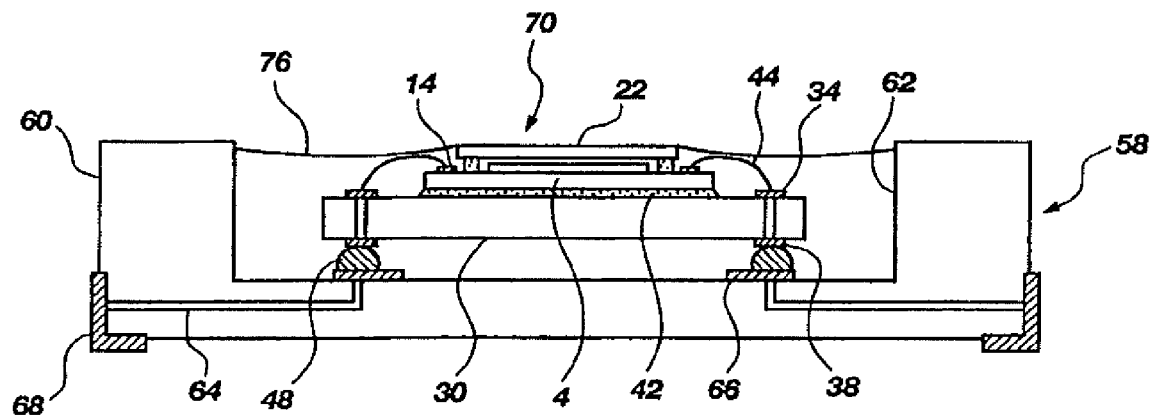
FIGS. 21A-21C show image sensor package subassemblies affixed to the leadless chip carrier in a variant of the fourth embodiment of the present invention.
Figure 21B:
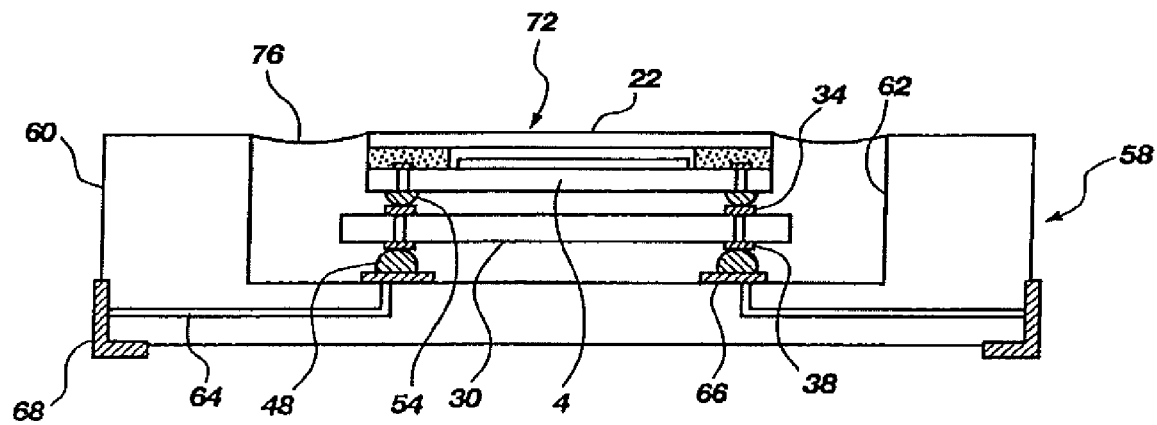
Figure 21C:
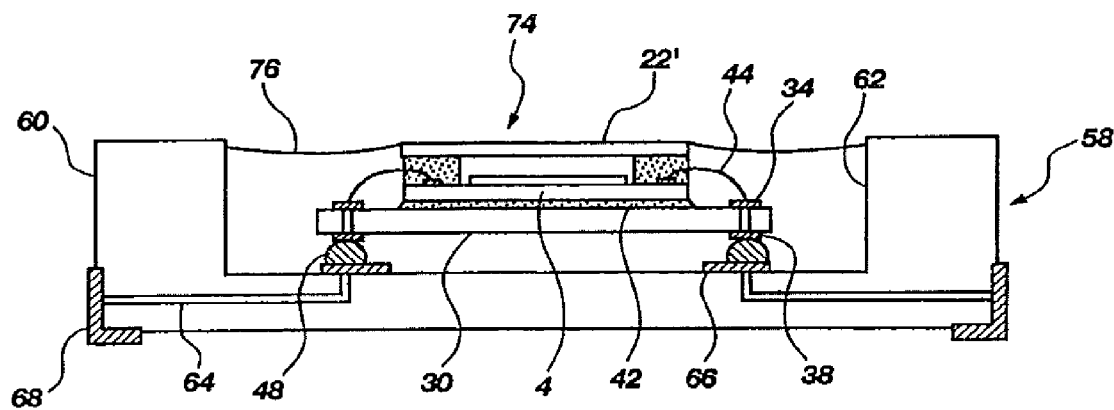

In one variant of the fourth embodiment, individual image sensor chips 4 having transparent covers 22 or 22' are formed and affixed to interposer 30 as in the first through third embodiments. Discrete conductive elements 48 are likewise added to the external connection points 38 of interposer 30. Rather than forming a layer of encapsulant material 46 on interposer 30, as in the first through third embodiments, interposer 30 is singulated to form a packaging subassembly, which is mounted within chip cavity 62 of LCC 58 by bonding discrete conductive elements 48 to attachment pads 66, as seen in FIGS. 21A-21C. FIG. 21A shows a packaging subassembly 70 mounted within chip cavity 62, wherein image sensor chip 4 and transparent cover 22 have been formed and affixed to interposer 30 as in the first embodiment. FIG. 21B shows a packaging subassembly 72 mounted within chip cavity 62, wherein image sensor chip 4 and transparent cover 22 have been formed and affixed to interposer 30 as in the second embodiment. FIG. 21C shows a packaging subassembly 74 mounted within chip cavity 62, wherein image sensor chip 4 and individual transparent cover 22' have been formed and affixed to interposer 30 as in the third embodiment. FIGS. 21A-21C show that to complete the image sensor chip package assembly 50, chip cavity 62 is then filled with a liquid sealant 76 that covers the packaging subassemblies 70, 72, or 74 and surrounds the edges of the transparent covers 22 or 22' attached to each image sensor chip 4. Liquid sealant 76 may be a curable polymer compound, such as an epoxy, resin or molding compound, or any other liquid sealant material known for use in sealing semiconductor packaging.

Figure 22A:
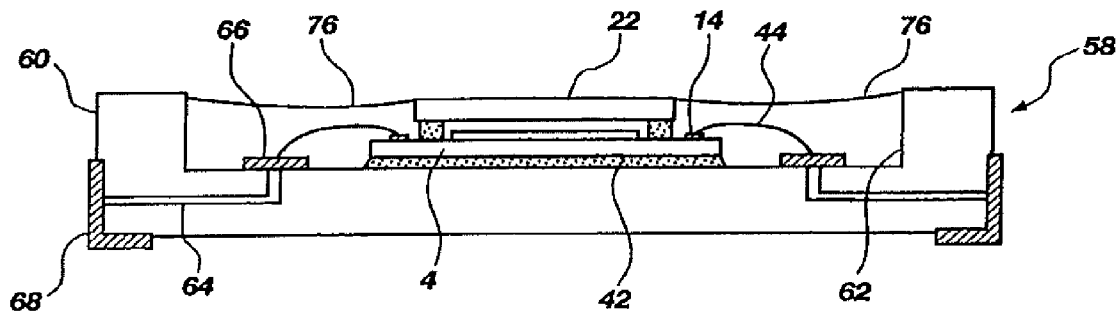
FIGS. 22A-22C show image sensor chips with attached transparent covers affixed directly to the leadless chip carrier in another variant of the fourth embodiment of the present invention.
Figure 22B:
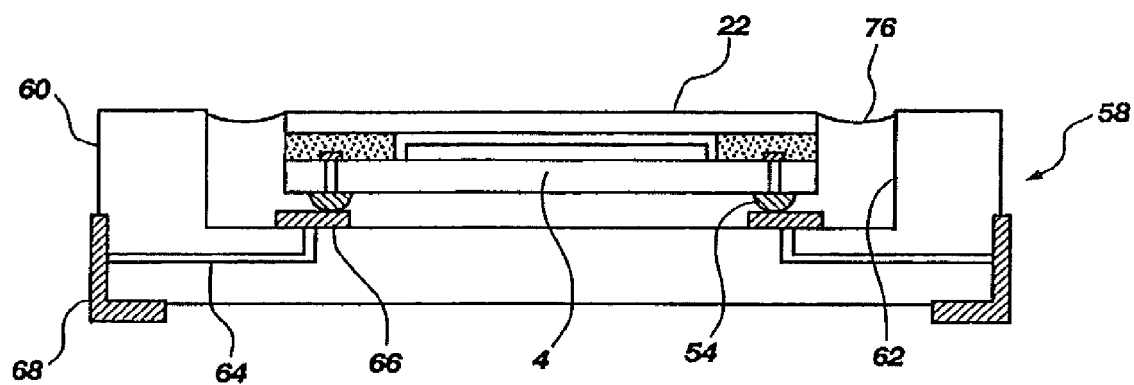
Figure 22C:
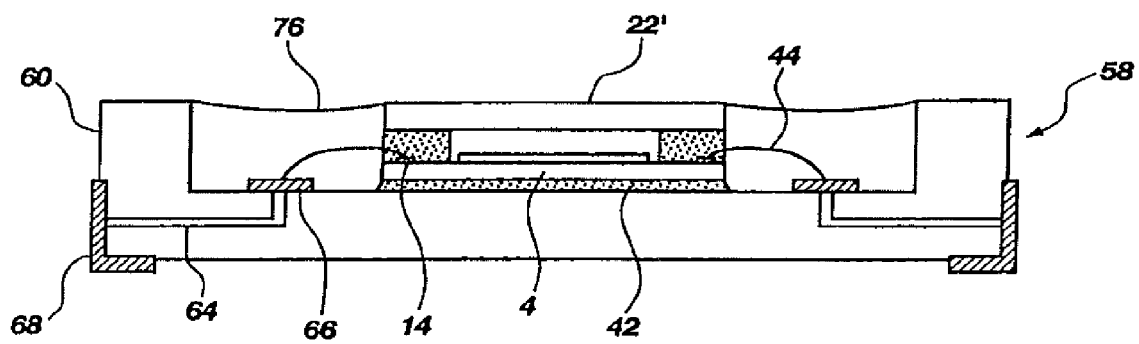

Another variant of the fourth embodiment is shown in FIGS. 22A-22C. Under this approach, individual image sensor chips 4 are formed with transparent covers 22 or 22' as in the first through third embodiments, but are not affixed to interposer 30. Instead, they are affixed directly to the bottom of the LCC 58 chip cavity 62 and electrically connected to attachment pads 66 such that LCC 58 itself provides the interposer substrate, as seen in FIGS. 22A-22C. FIG. 22A shows that an image sensor chip 4 with transparent cover 22, attached as in the first embodiment, is affixed to the bottom of chip cavity 62 with adhesive layer 42 and wire bonds 44 formed between bond pads 14 and attachment pads 66. FIG. 22B shows that an image sensor chip 4 with transparent cover 22, attached as in the second embodiment, is affixed to the bottom of chip cavity 62 by bonding back side conductive elements such as conductive bumps 54 directly to attachment pads 66. FIG. 22C shows that an image sensor chip 4 with individual transparent cover 22', attached as in the third embodiment, is affixed to the bottom of chip cavity 62 with adhesive layer 42 and wire bonds 44 formed between bond pads 14 and attachment pads 66. FIGS. 22A-22C show that to complete the image sensor chip package assembly 50, chip cavity 62 is then filled with liquid sealant 76 to cover image sensor chips 4 and surround the edges of the transparent covers 22 or 22'.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An electronic device package assembly, comprising:
   an interposer having at least one conductive pathway including an attachment pad on a surface thereof;
   an optically interactive device mounted to the interposer and having a surface with an image sensitive area, at least one conductive via extending from the surface to another, opposing surface of the optically interactive device and a conductive bump bonded between the at least one conductive via and the attachment pad;
   a transparent cover bonded to the surface of the optically interactive device over the image sensitive area and outside a peripheral edge thereof; and
   a layer of encapsulant material over the surface of the interposer partially covering the optically interactive device and leaving the transparent cover substantially exposed.

2. The electronic device package assembly of claim 1, wherein the at least one conductive pathway of the interposer includes an external connection point on another, opposing surface thereof.

3. The electronic device package assembly of claim 2, further comprising a discrete conductive element attached to the external connection point of the at least one conductive pathway.

4. The electronic device package of claim 1, wherein the layer of encapsulant material comprises one of a silicon-filled polymer and a liquid crystal polymer.

5. The electronic device package of claim 1, wherein the optically interactive device comprises an image sensor chip.

6. The electronic device package of claim 1, wherein the conductive bump comprises solder, conductive or conductor-filled epoxy, or metallic plating.

7. An electronic device package assembly, comprising:
- an interposer having at least one attachment pad on a surface thereof connected to a conductive via extending to another, opposing surface thereof;
- an optically interactive device having a surface with an image sensitive area, at least one bond pad outside the image sensitive area and a conductive via extending from the at least one bond pad to another, opposing surface of the optically interactive device;
- a conductive bump connecting the at least one attachment pad to the conductive via at the another, opposing surface of the optically interactive device; and
- a transparent cover bonded over the image sensitive area to the surface of the optically interactive device with an adhesive material disposed outside a peripheral edge of the image sensitive area and extending over the at least one bond pad.

8. The electronic device package of claim 7, wherein the transparent cover and the adhesive material extend to a peripheral edge of the optically interactive device.

9. An electronic device package assembly, comprising:
- an interposer having at least one attachment pad on a surface thereof connected to a conductive via extending to another, opposing surface thereof;
- an optically interactive device mounted to the interposer and having a surface with an image sensitive area and at least one bond pad outside the image sensitive area;
- a transparent cover bonded over the image sensitive area to the surface of the optically interactive device with a frame of adhesive material extending around a peripheral edge of the image sensitive area and over the at least one bond pad; and
- an electrical connection between the at least one bond pad and the at least one attachment pad extending through the adhesive material.

10. The electronic device package of claim 9, wherein the transparent cover and the frame of adhesive material extend to a periphery of the optically interactive device and the electrical connection extends beyond the frame of adhesive material.

* * * * *